(12) United States Patent
Duggal

(10) Patent No.: US 6,841,949 B2
(45) Date of Patent: Jan. 11, 2005

(54) COLOR TUNABLE ORGANIC ELECTROLUMINESCENT LIGHT SOURCE

(75) Inventor: Anil Raj Duggal, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/666,145

(22) Filed: Sep. 22, 2003

(65) Prior Publication Data

US 2004/0061107 A1 Apr. 1, 2004

Related U.S. Application Data

(62) Division of application No. 09/684,483, filed on Oct. 10, 2000, now Pat. No. 6,661,029.
(60) Provisional application No. 60/194,068, filed on Mar. 31, 2000.

(51) Int. Cl.[7] .................................................. G09G 3/10
(52) U.S. Cl. ..................... 315/169.3; 257/89; 438/34
(58) Field of Search .......................... 315/169.3; 257/40, 257/88–89, 91–92, 98, 100; 313/486, 500–503, 506; 438/29, 34, 99

(56) References Cited

U.S. PATENT DOCUMENTS

| | | | | |
|---|---|---|---|---|
| 4,015,166 A | * | 3/1977 | Ohshima et al. ............ 313/503 |
| 4,614,668 A | * | 9/1986 | Topp et al. .................... 427/66 |
| 5,247,190 A | | 9/1993 | Friend et al. .................. 257/40 |
| 5,294,870 A | | 3/1994 | Tang et al. ................... 313/504 |
| 5,424,560 A | * | 6/1995 | Norman et al. ............... 257/40 |
| 5,451,980 A | * | 9/1995 | Simon et al. .................. 345/88 |
| 5,688,551 A | | 11/1997 | Littman et al. ............... 427/64 |
| 5,707,745 A | * | 1/1998 | Forrest et al. ............... 428/432 |
| 5,708,130 A | | 1/1998 | Woo et al. ................... 528/397 |
| 5,773,130 A | * | 6/1998 | So et al. .................... 428/195.1 |
| 6,091,197 A | * | 7/2000 | Sun et al. .................... 313/509 |
| 6,264,805 B1 | * | 7/2001 | Forrest et al. ......... 204/192.26 |
| 6,337,492 B1 | | 1/2002 | Jones et al. ................. 313/503 |
| 6,395,328 B1 | * | 5/2002 | May ............................. 427/66 |
| 6,429,585 B1 | | 8/2002 | Kitazume et al. ........... 313/503 |
| 6,515,417 B1 | * | 2/2003 | Duggal et al. .............. 313/506 |
| 6,700,322 B1 | * | 3/2004 | Duggal et al. .............. 313/504 |
| 2001/0026124 A1 | * | 10/2001 | Liu et al. ..................... 313/504 |
| 2002/0011785 A1 | * | 1/2002 | Tang et al. .................. 313/506 |

OTHER PUBLICATIONS

R. H. Friend, "Optical Investigations of Conjugated Polymers", Journal of Molecular Electronics, 37–46, (1998).
Gerritt Klamer et al., "Colorfast Blue–Light Emitting Random Copolymers Derived Di–n–hexylfluorene and Anthracene", Adv. Mater. 993–997 (1998).
Junji Kido et al., "Organic electroluminescent devices based on molecularly doped polymers", Appl. Phys. Lett., 761–763 (1992).
Chung–Chih Wu et al., "Efficient Organic Electroluminescent Devices Using Single–Layer Doped Polymer Think Films with Bipolar Carrier Transpor Abilities", 44 IEEE Trans. on Elec. Devices 1269–1281 (1997).
A. W. Grice et al., "High brightness and efficiency blue light–emitting polymer diodes", Appl. Phys. Lett., 73, 629–431 (1998).
Hiroyuki Suzuki et al., "Near–ultraviolet electroluminescence from polysilanes", Thin Solid Films, 331, 64–70 (1998).

* cited by examiner

*Primary Examiner*—Thuy Vinh Tran
(74) *Attorney, Agent, or Firm*—Toan P. Vo; Patrick K. Patnode

(57) ABSTRACT

A light emitting device is provided. The light emitting device contains an array of organic light emitting diodes (OLEDs) emitting a plurality of colors, and a layer of scattering media above the light emitting surface of the OLED array. The emission color of the OLEDs may be tuned by applying different power to different sets of OLEDs. The scattering media mixes the colors from each set of OLEDs, such that the device light output has a white color having a desired color temperature.

4 Claims, 10 Drawing Sheets

COLOR TUNABLE ORGANIC ELECTROLUMINESCENT LIGHT SOURCE

This application is a division of application Ser. No. 09/684,483, filed Oct. 10, 2000, now U.S. Pat. No. 6,661,029 which is hereby incorporated by reference in its entirety.

This application claims the benefit of U.S. Provisional Application No. 60/194,068, filed Mar. 31, 2000, the disclosure of which is hereby incorporated by reference in its entirety.

BACKGROUND OF THE INVENTION

The present invention relates generally to lighting devices and more particularly to an organic light emitting diode.

Organic electroluminescent devices, such as organic light emitting diodes (OLEDs), are currently used for display applications and are planned for use in general lighting applications. An OLED device includes one or more organic light emitting layers disposed between two electrodes, e.g., a cathode and a light transmissive anode, formed on a light transmissive substrate. The organic light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine to form excited molecules or excitons. The excited molecules or excitons emit light when they decay.

Prior art light emitting OLED display devices are currently available. One such device is described in U.S. Pat. No. 5,688,551 (the '551 patent), incorporated herein by reference. An example of a prior art display device 1 is illustrated in FIG. 1, which is a circuit schematic of a device similar to that described in the '551 patent. The display device 1 contains an array of OLED subpixels 3. Each subpixel 3 emits a particular color, such as red, green and blue. The device 1 contains a plurality of pixels, each of which includes a red, a green and a blue subpixel 3. Thus, the color emitted by each pixel may be tuned by individually controlling the power provided to each subpixel 3, and a particular pixel may be tuned to emit white light.

The device 1 also contains a column driver circuit 5 and a row driver circuit 7, which control the application of power to each subpixel 3. In order to turn on a particular subpixel 13, the column driver circuit 5 must apply power to the third column in which the particular subpixel 13 is located, and the row driver circuit 7 must apply power to the second row in which the particular subpixel 13 is located. Thus, only the one subpixel 13 located in column three, row two emits light when power is applied to the third column and the second row. Therefore, each subpixel in a display device receives an individual power signal and each subpixel in the display device is controlled separately. Furthermore, each subpixel is separately connected to a power source, since each subpixel has a unique row and column address.

However, the present inventor has realized that such prior art OLED arrays, which are suitable for display devices, would suffer from several disadvantages if used for general lighting applications. The independent subpixel control in the display device of FIG. 1 requires complex fabrication processes and complex driver circuits, and is thus expensive to design and manufacture. This renders the display device of FIG. 1 impractically expensive for lighting applications. The present invention is directed to overcoming or at least reducing the problems set forth above.

BRIEF SUMMARY OF THE INVENTION

In accordance with one aspect of the present invention, there is provided a light emitting device, comprising an array of organic light emitting diodes (OLEDs) emitting a plurality of colors and a layer of scattering media above the light emitting surface of the array.

In accordance with another aspect of the present invention, there is provided a light emitting device, comprising: (a) an array of OLEDs comprising (i) a first set of a plurality of OLEDs electrically connected together to the same power source such that each OLED receives the same power signal at the same time, the first set of OLEDs emit light of a first color, and (ii) a second set of a plurality of OLEDs electrically connected together to the same power source such that each OLED receives the same power signal at the same time, the second set of OLEDs emit light of a second color different than the first color, and (b) a power controller which provides a first amount of power to the first set of OLEDs and a second amount of power to the second set of OLEDs to obtain a device light output having a desired color.

In accordance with another aspect of the present invention, there is provided a method of generating white light, comprising providing a first power signal having a first magnitude to a first set of plurality of OLEDs, such that the first set of OLEDs emit light of a first color, providing a second power signal having a second magnitude to a second set of plurality of OLEDs, such that the second set of OLEDs emit light of a second color different than the first color, and passing the light of the first color and the second color through a scattering medium to mix the light of the first and second colors such that the mixed light appears white to a human observer.

In accordance with another aspect of the present invention, there is provided a method of making a light emitting device, comprising: forming an array of OLEDs, electrically connecting a first set of OLEDs which emit light of a first color to the same power source, electrically connecting a second set of OLEDs which emit light of a different second color to the same power source, and forming a layer of scattering medium over the array of OLEDs.

BRIEF DESCRIPTION OF THE DRAWINGS

Other features and advantages of the invention will be apparent from the following detailed description of preferred embodiments and the accompanying drawings, in which.

DETAILED DESCRIPTION OF THE INVENTION

The present inventor has realized that, in contrast to display devices, where color mixing across different pixels and subpixels is not desirable, color mixing in a lighting device containing an OLED array is desirable in order to provide a smooth, uniform light for a lighting application. Thus, in one preferred embodiment of the present invention, a light emitting device contains a layer of scattering media above the light emitting surface of the array. The function of this scattering media is to facilitate mixing between the light emitted from the separate OLED devices.

The present inventor has also realized that it is desirable for a light emitting device to have a color tunable light output for general lighting applications, such as mood lighting for home or industry, or spotlights for theaters and discos. Thus, the light emitting device may be controlled by a user or by a computer to generate a desired color of the light emitted by the device. In contrast to a display device, where each OLED is controlled independently, various sets of plurality of OLEDs in the array are separately electrically connected so that they can be controlled in tandem by a power controller. A desired color of light is obtained by adjusting the power provided to the separate sets of OLEDs in the array.

I. The OLED Array

Figure 2:
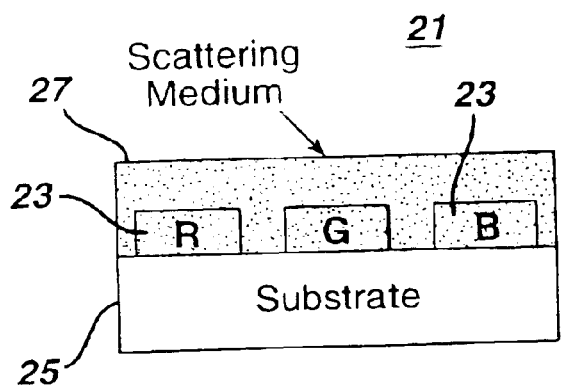
FIG. 2 is a side cross-sectional view of an array of organic light emitting diodes containing a light scattering medium according to a preferred embodiment of the present invention.

A side view of a light emitting device 21 containing the OLED array according to a first preferred embodiment is illustrated in FIG. 2. The horizontal array contains OLED devices 23, emitting light of different colors, formed over a substrate 25. The term light may include UV and IR radiation in addition to visible light of different colors (i.e., of different wavelength or color temperature). In a preferred aspect of the present invention, the array contains OLEDs emitting red, green and blue light (indicated by the letters R, G and B in the Figures). The light emitting surface of the array (i.e., the top surface in FIG. 2) is covered with a layer of scattering media 27 to promote mixing between the separate colors of light emitted by the red, green and blue OLEDs. Preferably, the scattering layer 27 is placed on top of the OLEDs 23, and if desired, also in the interstitial areas between the OLEDs.

The scattering media may comprise small particles with relatively high index of refraction that do not appreciably absorb the visible light from the OLED devices. The light scattering particles may have a mean particles size of 50 to 500 nm. Preferably, the mean particle size is between $\lambda/3$ and $\lambda/2$, where $\lambda$ is the peak emission wavelength of the OLEDs 23.

The preferred light scattering particles are titania, alumina, or zinc oxide particles, such as the Dupont R960 $TiO_2$ particles coated with an alumino-silicate glass having a mean particle size of 300 nanometers. However, $BaTiO_3$, $SiO_2$, $CaCO_3$, $BaSO_4$ and diamond light scattering particles may also be used. The scattering layer 27 may comprise a layer of packed light scattering particles or a carrier medium containing the light scattering particles. The carrier medium may be glass or a polymer materials, such as epoxy, silicone or urea resin. However, other carrier medium and scattering particle materials may be used, if desired.

Figure 3:
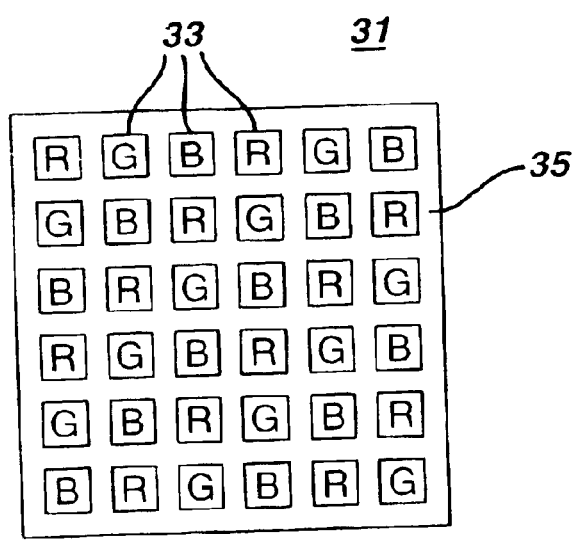
FIGS. 3–6 are top views of arrays of organic light emitting diodes according to preferred embodiments of the present invention.

FIG. 3 illustrates a top view of a white light emitting device 31 which includes the OLED 33 array tiled onto the substrate 35. The OLED devices emit light of three different colors, such as red, green and blue, which when mixed in different ratios provides different colors of white light (i.e., a white light having different color temperatures). However, other combinations of primary and/or mixed colors, such as a combination of blue and yellow light, may be used to produce white light.

In FIG. 3, the array of OLEDs 33 is depicted as a regular array of alternating red, green and blue OLEDs in a square pattern. However, the OLEDs may be formed in an irregular array or pattern. Furthermore, the different color OLEDs may have different shapes and areas, if desired. The different OLEDs 33 can be fabricated together on the device substrate 35 using patterning techniques such as shadow-masking, ink-jet printing or screen printing. Alternatively, the different OLED 33 can be fabricated separately and then physically attached onto the substrate 35.

OLED devices according to the second, third and fourth preferred embodiments will now be described. The electrical connections to the various OLED devices of the second through fourth preferred embodiments are arranged such that the relative ratio of total light emitted can be varied in order to tune the color of the emitted light. Thus, the OLED array of the light emitting device includes a first set of plurality of OLEDs electrically connected together to the same power source such that each OLED receives the same power signal at the same time. The first set of OLEDs emit light of a first color. The OLED array also includes a second set of plurality of OLEDs electrically connected together to the same power source such that each OLED receives the same power signal at the same time. The second set of OLEDs emit light of a second color different than the first color. The term "same power source" includes a single power source which provides a different amount of power to the first and second sets of OLEDs, as well as plural power sources, each of which provides the same amount of power to each OLED of one OLED set. The light emitting device also includes a power controller which provides a first amount of power to the first set of OLEDs and a second amount of power to the second set of OLEDs to obtain a device light output having a desired color.

Figure 4:
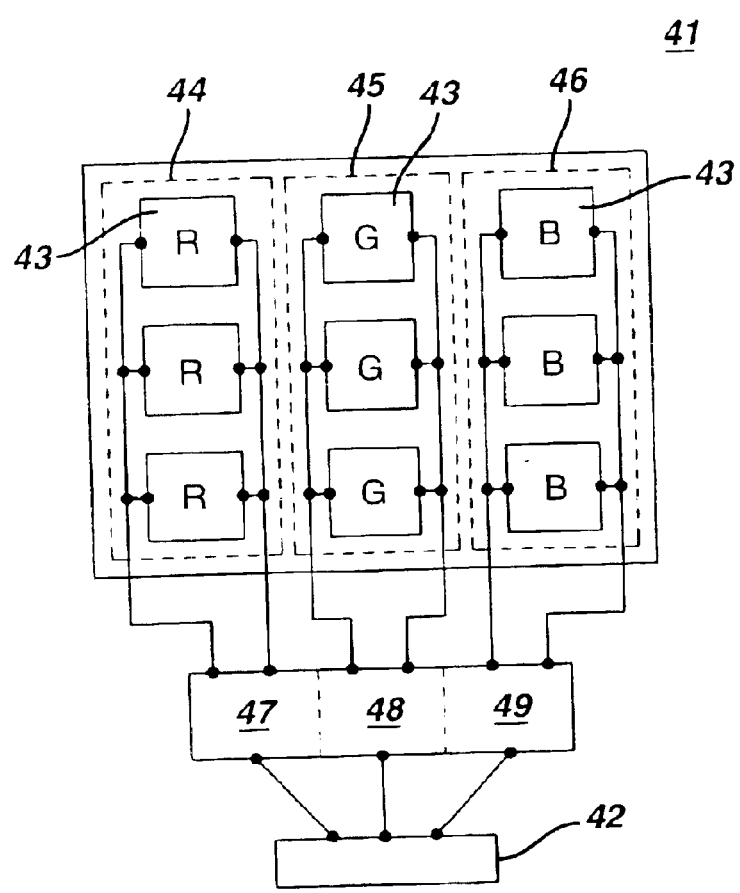
Figure 5:
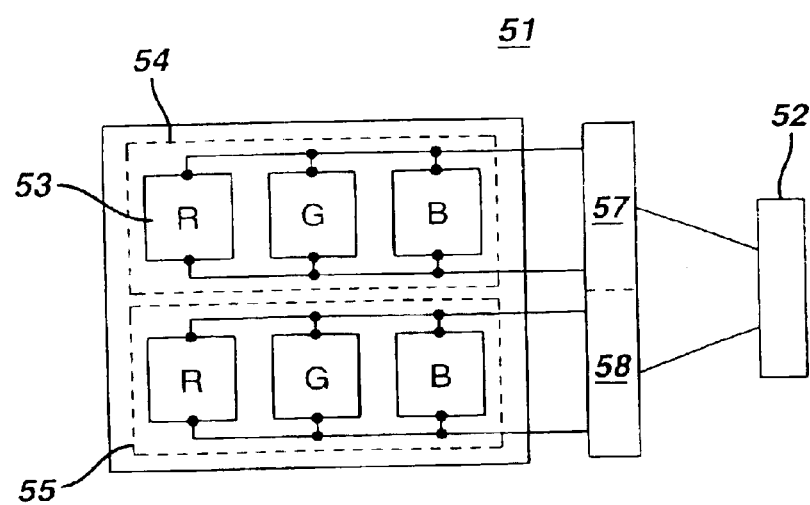
Figure 6:
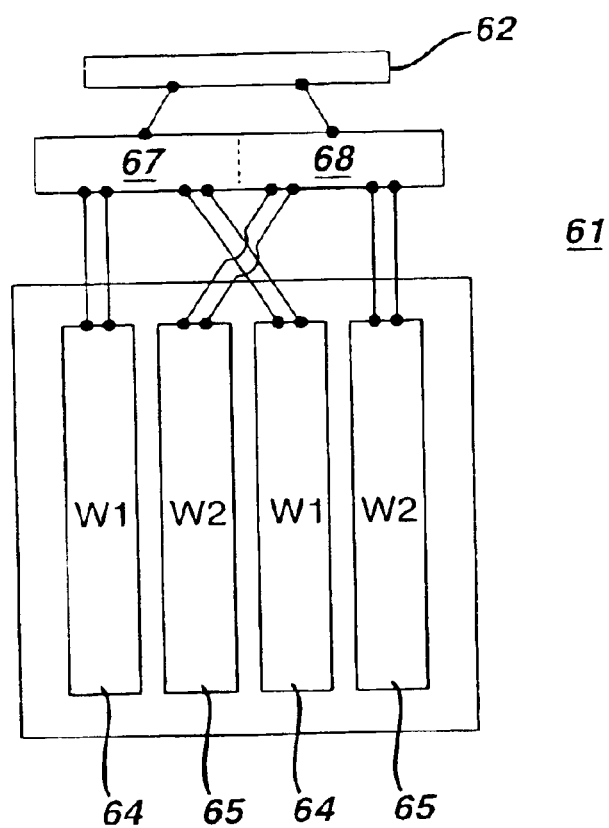

FIGS. 4–6 each illustrate a top view of a light emitting device according to the second through fourth preferred embodiments, respectively, which illustrate the above concept. Preferably the devices of the second through fourth embodiments contain the scattering media of the first embodiment. However, the scattering media may be omitted to simplify device processing.

FIG. 4 illustrates a light emitting device 41 according to the second preferred embodiment. The device 41 includes an integrated controller 42, such as a microprocessor or an ASIC chip. Alternatively, the controller may comprise a computer located remotely from the light emitting device, or a wall switch or dial which is actuated by the user.

In the device 41 illustrated in FIG. 4, the first set 44 of OLEDs 43 comprises a plurality of red light emitting OLEDs and the second set 45 of OLEDs comprises a plurality of green light emitting OLEDs. The device also includes a third set 46 of a plurality of blue light emitting OLEDs 43 electrically connected together to the same power source such that each OLED receives the same power signal at the same time. In other words, all the OLEDs 44 which emit red light can be connected together, all the OLEDs 45 which emit green light can be connected together, and all the OLEDs 46 which emit blue light can be connected together, as illustrated in FIG. 4. In this manner, all colors from the pure red, green and blue to the various mixed whites can be obtained.

Each of the first, second and third sets of OLEDs 44, 45, 46 are connected in parallel to their respective power source 47, 48, 49. While not as preferred, the OLEDs alternatively may be connected to their respective power sources in series. The power sources 47, 48 and 49 may comprise driver circuits or switches connected to an outside voltage source, such as a power outlet or battery. Furthermore, the separate power sources 47, 48 and 49 may alternatively comprise a single driver circuit which is capable of simultaneously providing a different power signal to each OLED set.

The device 41 operates as follows. The controller 42 actuates the first power source 47 to provide a first power signal having a first magnitude to a first set of plurality of OLEDs 44, such that the first set of OLEDs 44 emits red light of a first color. Simultaneously, the controller 42 actuates the second power source 48 to provide a second power signal having a second magnitude to a second set of plurality of OLEDs 45, such that the second set of OLEDs emits green light. The controller 42 also actuates the third power source 49 to provide a third power signal having a third magnitude to a third set of plurality of OLEDs 46, such that the third set of OLEDs emits blue light. The tuned red, green and red light appears as white light of a desired color and color temperature to a human observer.

FIG. 5 illustrates a light emitting device 51 according to the third preferred embodiment. The OLED array in device 51 comprises a first set of OLEDs 54 which contains a plurality of red, green and blue light emitting OLEDs 53. The array also contains a second set of OLEDs 55 which contains second set of a plurality of red, green and blue light emitting OLEDs 53. The red, green and blue light emission from the first set of OLEDs 54 appears as a first white color light, and the red, green and blue light emission from the second set of OLEDs 55 appears as a second white color light different from the first white color light. For example, the white light emitted from the first set of OLEDs 54 has a first color temperature, while the white light emitted from the second set of OLEDs 54 has a different, second color temperatures. Then by separately controlling the power from the respective power sources 57, 58 to these two sets OLEDs by using the controller 52, white light having any color or color temperature value between respective values of color or color temperature of the white light emitted by the two sets of OLEDs 54, 55 can be obtained.

FIG. 6 depicts a white light emitted device 61 according to the fourth preferred embodiment of the present invention. In FIG. 6, a plurality of OLEDs are placed in the array. The array comprises two different types of white light emitting OLEDs. The first type of OLEDs 64 emit white light having a first color temperature (labeled "W1" in FIG. 6). The second type of OLEDs 65 emit white light having a second color temperature (labeled "W2" in FIG. 6) different from the first temperature.

Electrically, the first set of white light emitting OLEDs 64 which emit white light having the same first color temperature, are electrically connected together to the same power source 67. The second set of white light emitting OLEDs 65 which emit white light having the same second color temperature, are electrically connected together to the same power source 68, but separately from the first OLEDs 64. By varying the power to the two different sets of OLEDs 64, 65, using the controller 62 all color temperatures between the individual OLED color temperatures can be achieved.

The white light emitting OLEDs can be made for instance using a blue light emitting OLED device covered with a downshifting phosphor, such as the phosphor described in U.S. Application Ser. No. 60/178,451, incorporated by reference in its entirety. Preferably, the phosphor comprises an $ADE:Ce^{3+}$ phosphor, where A comprises at least one of Y or Gd, D comprises at least one of Al, Ga or Sc and E comprises oxygen. This phosphor emits yellow light, such that the combined blue and yellow emission from the OLEDs appears as white light to a human observer. A specific example of such a phosphor is $Y_3Al_5O_{12}:Ce^{3+}$ (commonly known as $YAG:Ce^{3+}$). The preferred organic blue light emitting polymer layer in an OLED is poly(9,9-di-n-hexylfluorene-2,7-diyl). However, other phosphors and organic light emitting materials may be suitable in these applications. The OLED preferably also contains a transparent ITO anode and a LiF/Al bilayer cathode.

The different color temperatures can be obtained by using different phosphors with the same blue OLED device. For example, by substituting Y ions with Gd ions, the $ADE:Ce^{3+}$ phosphor yellow emission shifts to longer wavelengths. Thus, the combination of the blue OLED light and the longer wavelength yellow light emitted by such phosphor appears as white light having a lower color temperature, such as a color temperature of about 2500K to about 5000K. In contrast, by substituting Al ions with Ga ions, the $ADE:Ce^{3+}$ phosphor yellow emission shifts to shorter wavelengths. Thus, the combination of the blue OLED light and the shorter wavelength yellow light emitted by such phosphor appears as white light having a higher color temperature, such as a color temperature of about 5000K to about 8500K. Therefore, by varying the power to OLEDs 64, 65, a device 61 white light output having a color temperature between 2500K and 8500K can be obtained.

Figure 1:
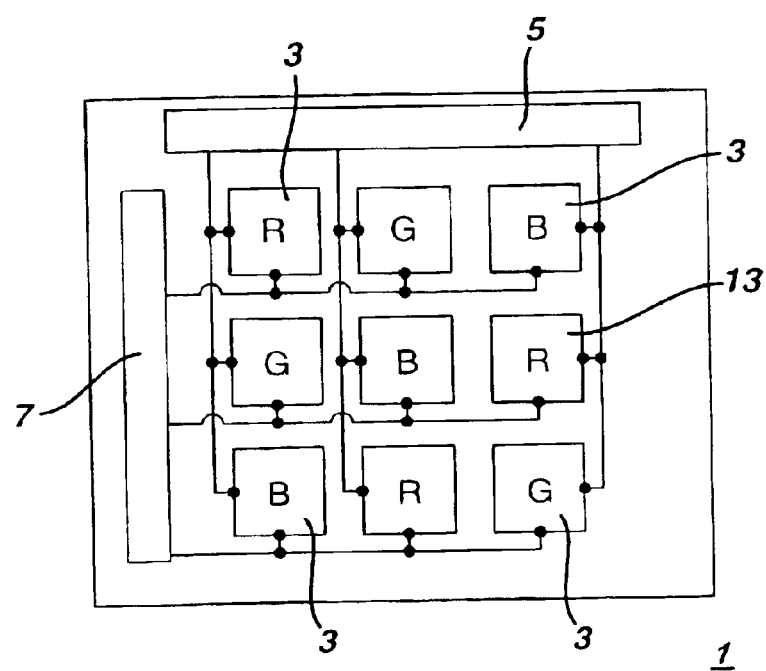
FIG. 1 is a top view of a prior art display device containing an array of organic light emitting diodes.
Figure 15:
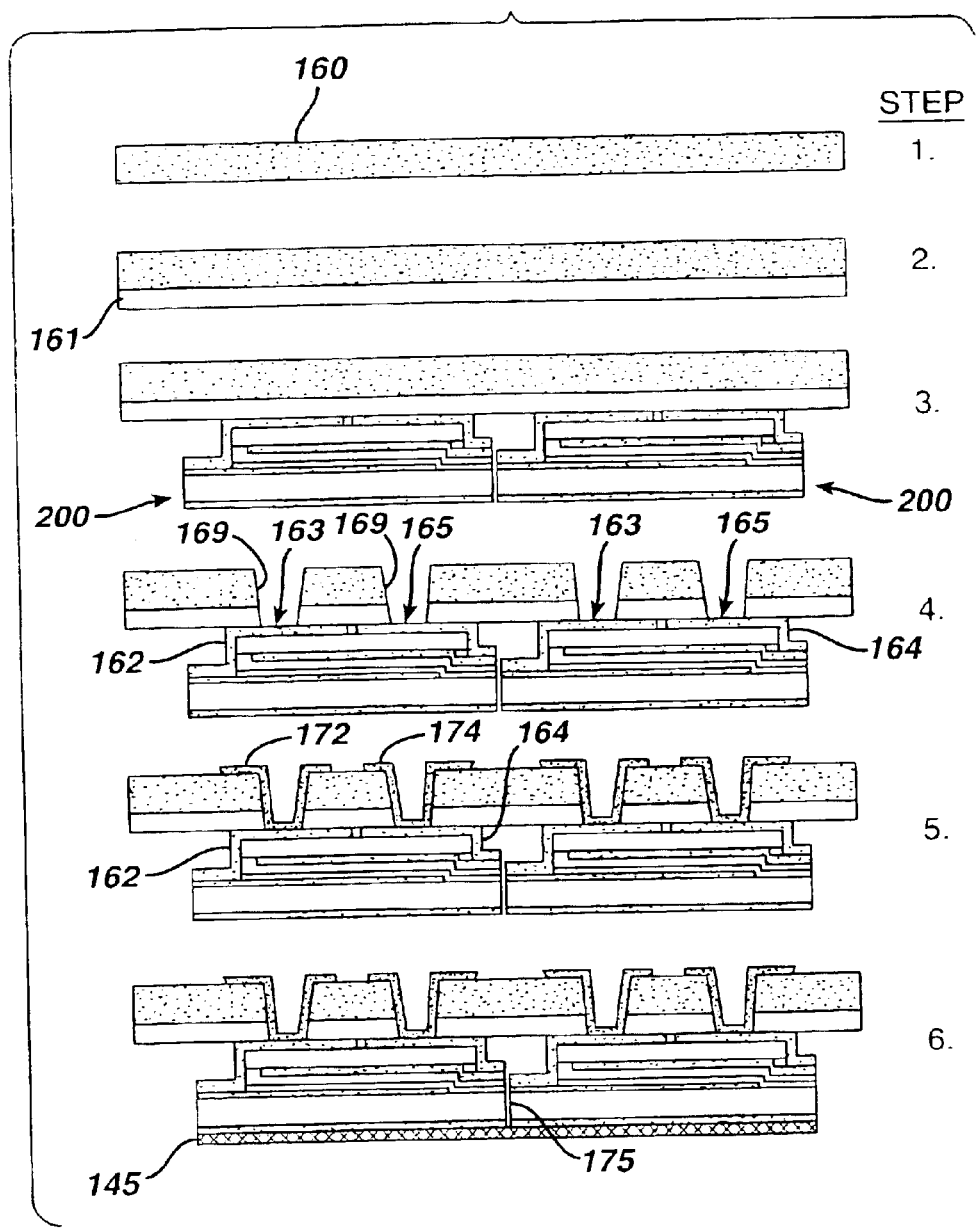
FIG. 15 illustrates a method of mounting a plurality of light emitting devices on a mounting substrate to produce a light emitting device according to a preferred embodiment of the invention.

While the electrical contacts illustrated in FIGS. 4–6 are shown as being located between the individual OLEDs, the contacts may be placed in other locations. For example, the electrical contacts may be located on the back side of the mounting substrate, as illustrated in FIG. 15. Alternatively, the electrical contacts may be located between each OLED and the substrate and/or over the top of each OLED. Furthermore, as illustrated in FIGS. 4–6, each OLED is connected to two row or two column electrodes, to allow for common control of a plurality of OLEDs. In contrast, each subpixel 3 in FIG. 1 is connected to one row and one column electrode to allow for independent subpixel control.

II. The Components of the OLED Device

Figure 7:
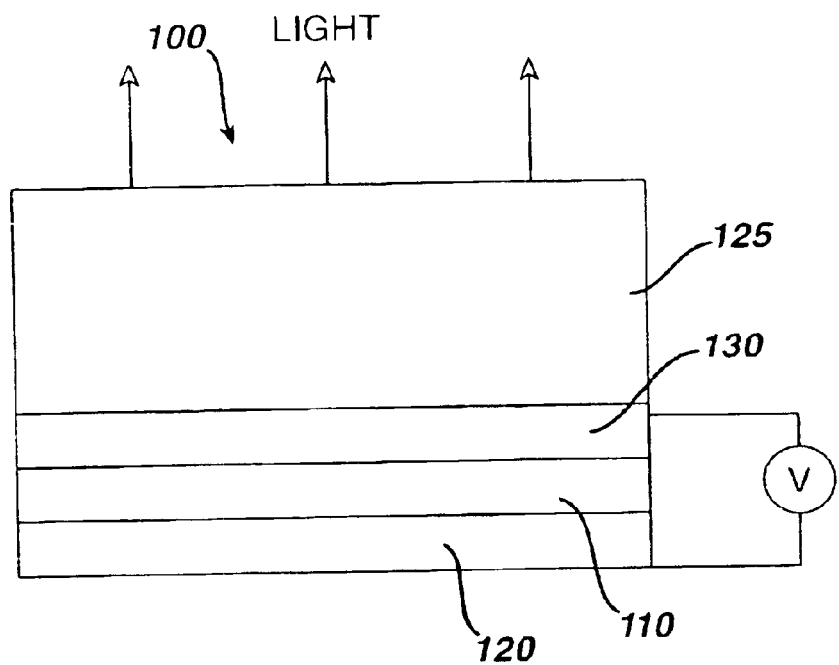
FIG. 7 is a side cross-sectional view of an organic light emitting diode according to one preferred embodiment of the invention.

The OLED described above may comprise any type of organic light emitting diode or device. The term "light" includes visible light as well as UV and IR radiation. The device 100 according to one preferred aspect of the present invention is illustrated in FIG. 7. The device 100 includes an organic light emitting layer 110 disposed between two electrodes, e.g., a cathode 120 and an anode 130. The organic light emitting layer 110 emits light upon application of a voltage across the anode and cathode from the voltage source "V". The organic light emitting device 100 typically includes a device substrate 125, such as glass or transparent plastics such as PET (MYLAR®), polycarbonate, and the like, as shown in FIG. 7. The term "organic light emitting device" generally refers to the combination which includes the organic light emitting layer, the cathode, and the anode, and which may also include other elements such as the device substrate, device electrical contacts, and a photoluminescent layer, as will be described below.

A. The Electrodes

The anode and cathode inject charge carriers, i.e., holes and electrons, into the organic light emitting layer 110 where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer 110 typically has a thickness of about 50–500 nanometers, and the electrodes 120, 130 each typically have a thickness of about 100–1000 nanometers.

The cathode 120 generally comprises a material having a low work function value such that a relatively small voltage causes emission of electrons from the cathode. The cathode 120 may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode 130 typically comprises a material having a high work function value. The anode 130 is preferably transparent so that light generated in the organic light emitting layer 110 can propagate out of the organic light emitting device 100. The anode 130 may comprise, for example, indium tin oxide (ITO), tin oxide, nickel, or gold. The electrodes 120, 130 can be formed by conventional vapor deposition techniques, such as evaporation or sputtering, for example.

B. The Organic Emitting Layer(s)

A variety of organic light emitting layers 110 can be used in conjunction with exemplary embodiments of the invention. According to one embodiment shown in FIG. 7, the organic light emitting layer 110 comprises a single layer. The organic light emitting layer 110 may comprise, for example, a conjugated polymer which is luminescent, a hole-transporting polymer doped with electron transport molecules and a luminescent material, or an inert polymer doped with hole transporting molecules and a luminescent material. The organic light emitting layer 110 may also comprise an amorphous film of luminescent small organic molecules which can be doped with other luminescent molecules.

According to other embodiments of the invention shown in FIGS. 8–11, the organic light emitting layer 110 comprises two or more sublayers which carry out the functions of hole injection, hole transport, electron injection, electron transport, and luminescence. Only the luminescent layer is required for a functioning device. However, the additional sublayers generally increase the efficiency with which holes and electrons recombine to produce light. Thus the organic light emitting layer 110 can comprise 1–4 sublayers including, for example, a hole injection sublayer, a hole transport sublayer, a luminescent sublayer, and an electron injection sublayer. Also, one or more sublayers may comprise a material which achieves two or more functions such as hole injection, hole transport, electron injection, electron transport, and luminescence.

Embodiments in which the organic light emitting layer 110 comprises a single layer, as shown in FIG. 7, will now be described. According to one embodiment, the organic light emitting layer 110 comprises a conjugated polymer. The term conjugated polymer refers to a polymer which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g. replacing the phenylene ring with an anthracene or napthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer 110 which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference. Another preferred blue light emitting polyfluorine is poly(9,9-di-n-hexylfluorine-2,7-diyl) which has a broad double emission peak between about 415 and 460 nm.

According to a another embodiment of a single layer device as shown in FIG. 7, the organic light emitting layer 110 comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum (IR) (Alq). TDP has a high hole drift mobility of $10^{-3}$ $cm^2$/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761–763 (1992), which is hereby incorporated by reference.

Figure 8:
FIGS. 8–11 illustrate various examples of organic light emitting layers formed of two or more sublayers.

According to another embodiment of the invention shown in FIG. 8, the organic light emitting layer 110 comprises two sublayers. The first sublayer 111 provides hole transport, electron transport, and luminescent properties and is positioned adjacent the cathode 120. The second sublayer 112 serves as a hole injection sublayer and is positioned adjacent the anode 130. The first sublayer 111 comprises a hole-transporting polymer doped with electron transporting molecules and a luminescent material, e.g. a dye or polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprise the organic dyes coumarin 460 (blue), coumarin 6 (green) or nile red. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer 112 serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269–1281 (1997), which is hereby incorporated by reference.

Figure 9:

According to another embodiment of the invention shown in FIG. 9, the organic light emitting layer 110 includes a first sublayer 113 comprising a luminescent sublayer and a second sublayer 114 comprising a hole transporting sublayer. The hole transporting sublayer 114 may comprise an aromatic amine that is readily and reversibly oxidizable, for example. One example of such a luminescent sublayer and a hole transporting sublayer is described in A. W. Grice et al, "High Brightness and Efficiency of Blue Light-Emitting Polymer Diodes", 73 Appl. Phys. Letters 629–631 (1998), which is hereby incorporated by reference. The device described therein comprises two polymer layers sandwiched between an ITO electrode and a calcium electrode. The polymer layer next to the ITO is a hole transport layer and comprises a polymeric triphenyldiamine derivative (poly-TPD). The blue emitting polymer layer which is next to the calcium electrode is poly(9,9-dioctylfluorene).

Figure 10:
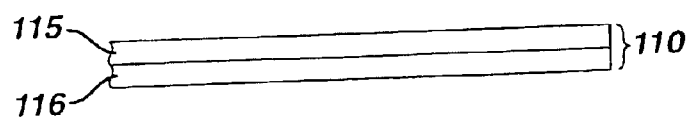

According to another embodiment of the invention shown in FIG. 10, the organic light emitting layer 110 comprises a first sublayer 115 which includes luminescent and hole transport properties, and a second sublayer 116 which includes electron injection properties. The first sublayer 115 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly (methyl-phenylsilane) (PMPS), and poly[-bis(p-butylphenyl)silane] (PBPS). The polysilane sublayer 115 can be applied by spin coating from a toluene solution, for example. The electron injection sublayer 116 may comprise 2,5-bis(4-biphenyl)-1,3,4-oxadiazole (BBD), for example. Additional information on UV-emitting polysilane organic light emitting layers is described in Hiroyuki Suzuki et al, "Near-ultraviolet Electroluminescence from Polysilanes", 331 Thin Solid Films 64–70 (1998), which is hereby incorporated by reference.

Figure 11:
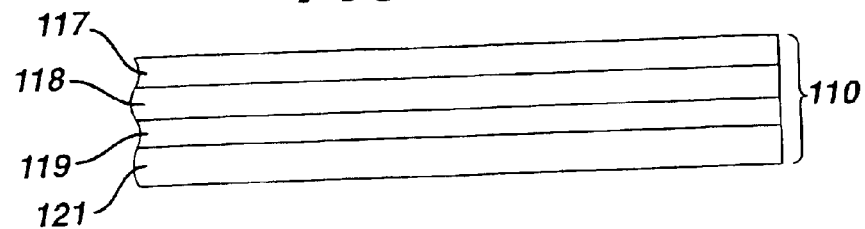

According to another embodiment of the invention shown in FIG. 11, the organic light emitting layer 110 comprises a hole injecting sublayer 117, a hole transporting sublayer 118, a luminescent sublayer 119, and an electron injecting sublayer 121. The hole injecting sublayer 117 and hole transporting sublayer 118 efficiently provide holes to the recombination area. The electrode injecting sublayer 121 efficiently provides electrons to the recombination area.

The hole injecting sublayer 117 may comprise a porphyrinic compound, such as a metal free phthalocyanine or a metal containing phthalocyanine, for example. The hole transporting sublayer 118 may comprise a hole transporting aromatic tertiary amine, where the latter is a compound containing at least one trivalent nitrogen atom that is bonded only to carbon atoms, at least one of which is a member of an aromatic ring. The luminescent sublayer 119 may comprise, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. The electron injection sublayer 121 may comprise a metal oxinoid charge accepting compound such as a tris-chelate of aluminum. Additional information on such four-layer materials and devices are described in U.S. Pat. No. 5,294,870, which is hereby incorporated by reference.

The above examples of organic light emitting layers 110 can be used to design an organic light emitting device which emits in one or more desired colors. For example, the organic light emitting device 100 can emit ultraviolet, blue, green, or red light.

C. The Photoluminescent Layer

Figure 12:
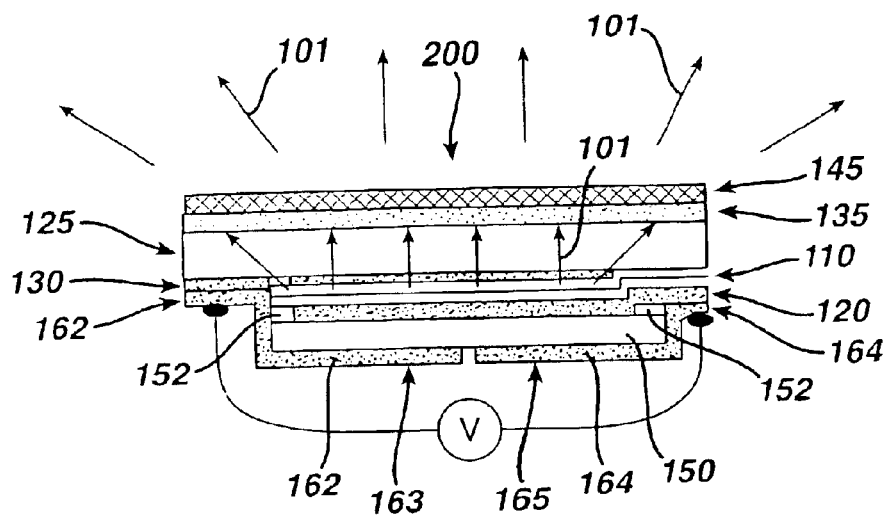
FIG. 12 is a side cross-sectional view of an organic light emitting diode according to another preferred embodiment of the invention.

As shown in FIG. 12, the organic light emitting device 200 may optionally include a photoluminescent layer 135. The photoluminescent layer 135 comprises a photoluminescent material which absorbs light from the organic light emitting layer 110 and emits light typically having a longer wavelength. The photoluminescent material preferably comprises an inorganic phosphor, such as YAG:$Ce^{3+}$, but may also comprise an organic photoluminescent material such as an organic dye.

D. Sealing Member and Contacts

Figure 13:
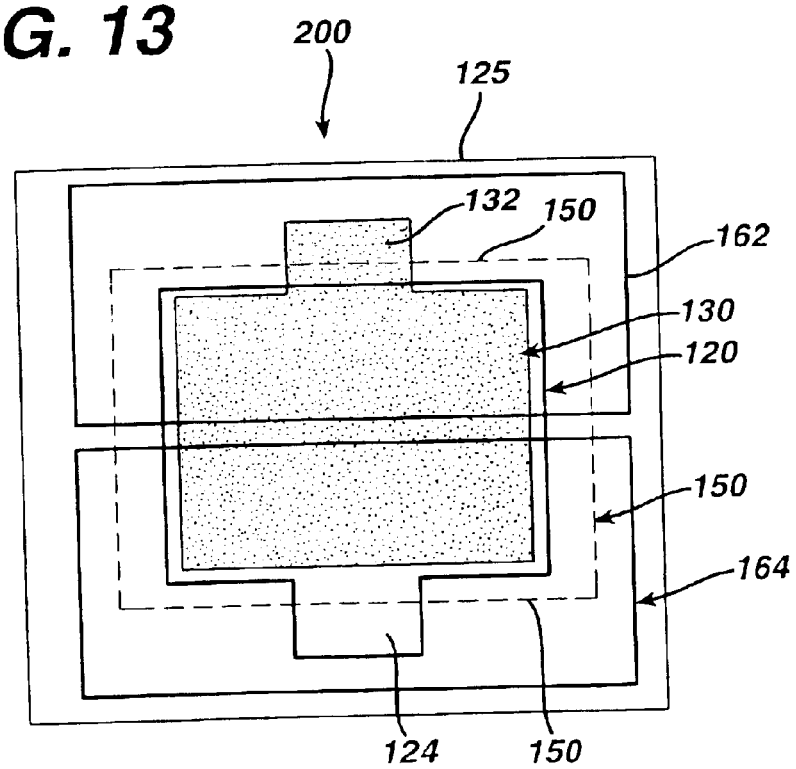
FIG. 13 is a bottom view of the organic light emitting diode of FIG. 12.

Referring to FIGS. 12 and 13, an organic light emitting device is shown according to another embodiment of the invention. The organic light emitting device 200 comprises an organic light emitting layer 110, a cathode 120, and an anode 130 which is light transmissive. The organic light emitting device 200 also includes a device substrate 125 which is light transmissive. The elements in FIGS. 12 and 13 (e.g. the anode 130, cathode 120, light emitting layer 110) corresponding to those in FIG. 7 can be formed of the same materials as described above with respect to FIG. 7. Upon application of a voltage, light (represented by arrows 101) is generated in the light emitting layer 110 and propagates through the anode 130 and the device substrate 125.

Adjacent to the cathode 120 is a sealing member 150, typically comprising glass, which provides a barrier to oxygen and water. The sealing member 150, in conjunction with a sealant 152 which may comprise epoxy, a metal, or a glass frit, for example, provides a near hermetic barrier to prevent water and oxygen penetration into the cathode 120, anode 130 and organic light emitting layer 110.

Formed adjacent to the sealing member 150 are first and second device electrical contacts 162, 164, which provide electrical connections to the anode 130 and cathode 120, respectively. As shown most clearly in FIG. 13, the first device electrical contact 162 connects electrically to the anode 130 in a tab region 132 of the anode 130. The tab region 132 is beyond the perimeter of the sealing member 150. The second device electrical contact 164 connects electrically to the cathode 120 in a tab region 124 of the cathode 120. The tab region 124 is beyond the perimeter of the sealing member 150. The organic light emitting layer 110 (not shown in FIG. 13) typically occupies at least the overlap region of the anode 130 and cathode 120 and may extend beyond these electrodes.

Referring again to FIG. 12, the device electrical contacts 162, 164 typically have respective device contacting surfaces 163, 165 which occupy a common plane. These device contacting surfaces 163, 165 facilitate the mounting of one or more organic light emitting devices 200 onto a mounting substrate, as will be described further below in connection with FIG. 12.

An advantageous feature of the device electrical contacts 162, 164 can be described with reference to an imaginary surface running through the light emitting layer 110. The imaginary surface, which is typically planar, divides the organic light emitting device 200 into a first side and a second side. The anode 130 is on the first side, and the cathode 120 is on the second side. The light is emitted through the first side, and the device electrical contacts 162, 164 extend to the second side. For example, the first device electrical contact 162 extends from the anode 130 on the first side to the second side of the organic light emitting device. The second device electrical contact 164 extends from the cathode 120 on the second side to another location on the second side of the organic light emitting device. Thus, the organic light emitting device 200 can be powered by contacting both device electrical contacts 162, 164 on a common planar surface 163, 165 which is on an opposite side of the organic light emitting device as where the light emission occurs. Typically the planar surface defined by surfaces 163, 165 is parallel to the light emitting layer 110 and the device substrate 125. This configuration allows a number of organic light emitting devices 200 to be easily mounted adjacent to each other ("tiled") on a mounting substrate.

As shown in FIG. 13, the device substrate 125 can define the area of the organic light emitting device 200. The first and second device electrical contacts 162, 164 can occupy an area which is within the area of the device substrate 125. Therefore, two organic light emitting devices 200 can be placed directly adjacent to each other without any electrical connectors in between and with a small separation distance between the adjacent light emitting device substrates 125. For example, if desired, the separation distance could be less than 2 centimeters (cm), 1 cm, 0.5 cm or 0.25 cm, but is typically greater than 0.1 cm.

E. Light Scattering Layer

The organic light emitting device 200 also includes the layer of light scattering media 145 comprising light scattering particles for effective color mixing, as described above. The scattering layer 145 is preferably formed over the top and sides of each organic light emitting device. However, if desired, the scattering layer may be formed only over the top of each device 200, as illustrated in FIG. 12.

F. The Optional Shaped Material

In one embodiment of the present invention, an optional shaped transparent material is formed onto the emitting surface of the device to improve the device quantum efficiency. The transparent material can be any transparent polymer or glass, for example, and can be filled with high index nanoparticles such that its index of refraction matches that of the device. This reduces the Fresnel loss in the external quantum efficiency of the device. The transparent material is shaped such that its top, light emitting, surface has dimples or corrugations which reduce the amount of light lost through total internal reflection. This reduces the critical angle loss in the external quantum efficiency of the device.

The shaped material may be an additional layer attached to the light emitting surface of the device substrate 125. Alternatively, the shaped material may comprise the device substrate 125. The shaped transparent material typically has an index of refraction which is matched to or close to the index of refraction of the substrate or the active layer of the OLED device 100. The shape of the material to be attached is flat on the side of attachment and dimpled or corrugated, for example, on the side from which light is emitted into the ambient environment. The height of the corrugations or dimples is typically greater than 0.1 micron and typically covers the whole surface. The spacing between dimple or corrugation peaks is typically within a factor of 10 of their height. The spacing does not have to conform to a regular pattern. As an example, the shaped transparent material can be made with any thermoplastic, thermoset, or elastomer material that is transparent and can be molded into the desired structure.

The index of refraction of the material can be adjusted to match that of the surface of the device 100 by the mixing of high index of refraction nanoparticles, such as $TiO_2$ or ZnO, into a base polymer or glass material, such as epoxy. In this manner, the index of the resulting composite can be adjusted between the values of the pure base and the pure filler. Preferably, the size of the nanoparticles is less than 100 nanometers to eliminate scattering effects and ensure transparency. The shaped material can be attached to the light emitting surface of the device 100 by means of a transparent adhesive, such as an epoxy. It is typically desirable that the epoxy have close to the same index of refraction as that of the device 100 surface. This can be achieved by filling the epoxy with a specific amount of nanoparticle.

In another embodiment of the present invention, the layer of scattering media 145 and the index matched material comprise the same layer. In this embodiment, the nanoparticles having a size less than 100 nanometers are mixed into the to layer of scattering media 145 to adjust the index of refraction of the layer 145 such that it is equal to or close to the index of refraction of the device substrate 125. Furthermore, the layer of scattering media 145 may also have a dimpled light emitting surface in order to reduce the critical angle loss at the light emitting surface of the layer 145.

III. Method of Making the OLED Device

Figure 14:
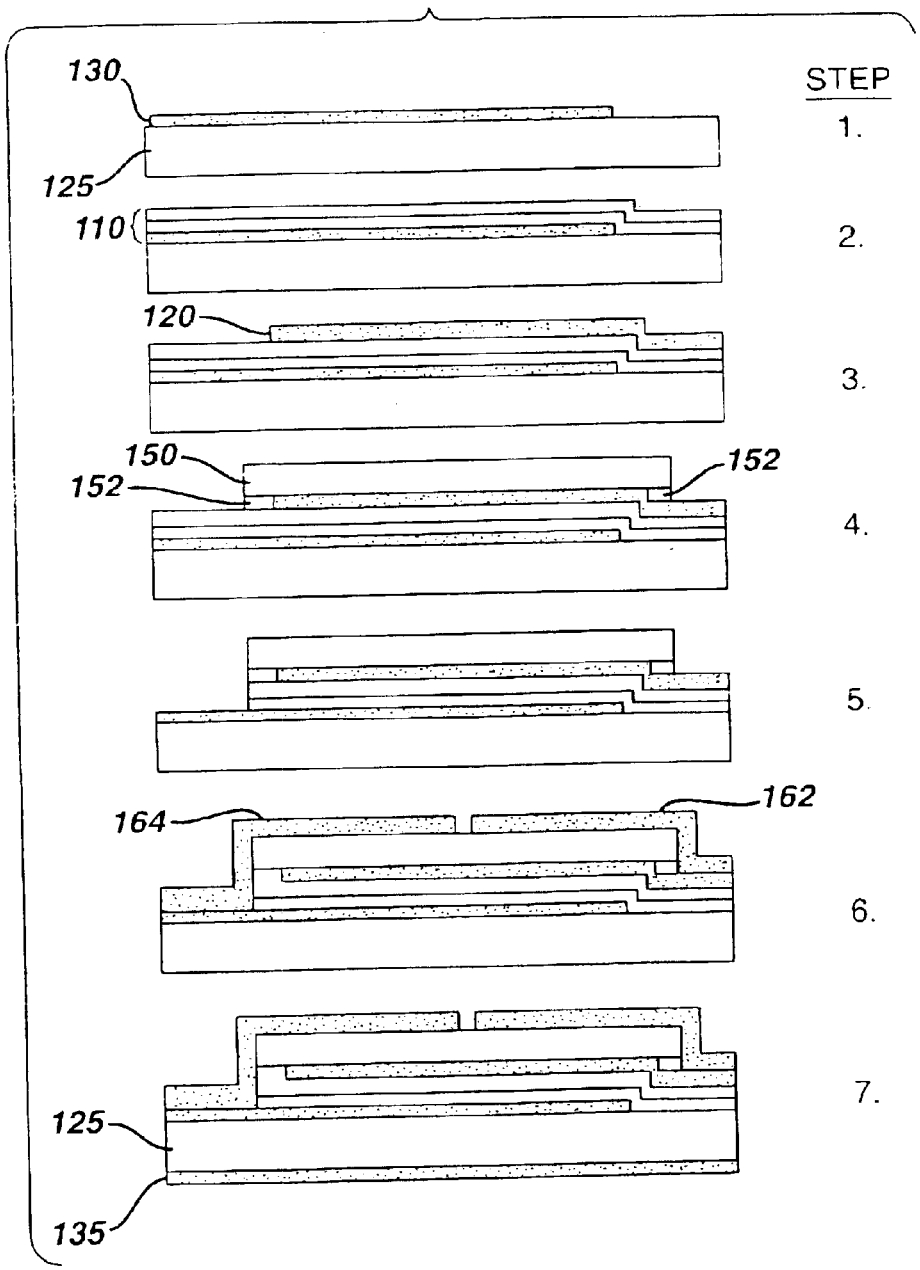
FIG. 14 illustrates a method of making the organic light emitting diode of FIG. 12 according to a preferred embodiment of the present invention.

FIG. 14 illustrates a method for forming the organic light emitting device 200 of FIGS. 12 and 13 according to an exemplary embodiment of the invention. As shown in FIG. 14, step 1, a glass substrate 125 is sputter coated with a layer of thin indium tin oxide (ITO). The ITO is then patterned to form the anode 130, e.g. in the pattern shown in FIG. 13. In step 2, the organic light emitting layer 110 (which may include one or more sublayers as shown in FIGS. 7–11) is deposited, for example by spin coating or inkjet processing. In step 3, the cathode 120 is deposited as a reflective structure comprising a thin layer of lithium fluoride overcoated with aluminum, for example. The cathode 120 can be deposited through a stencil mask by evaporation, for example. The sealing member 150, which may comprise glass, for example, is next applied with a sealant 152 in step 4 to form a near hermetic barrier.

In step 5, the organic light emitting layer 110 extending beyond the sealing member 150 is removed by solvent or dry etching methods. The device electrical contacts 162, 164, which may comprise a metal such as aluminum or silver, are then applied to the reflective side of the organic light emitting device 200 in step 6. The device electrical contacts 162, 164 allow for external contact to the organic light emitting device and additionally can provide a near hermetic seal to the anode 130, cathode 120, and light emitting layer 110. In step 7, optionally, a layer 135 of photoluminescent material, e.g. an inorganic phosphor, is applied to the device substrate 125. Optionally, a layer of scattering particles can be applied in a subsequent step. The steps shown in FIG. 14 are of course merely an example of a method of making a light source, and not intended to be limiting.

FIG. 15 illustrates a method of mounting one or more organic light emitting devices onto a mounting substrate to form a light emitting device according to an exemplary embodiment of the invention. Step 1 shows the mounting substrate 160, which may comprise a conventional printed circuit board such as FR4 or GETEK, or a flexible polymer film such as Kapton E™ or Kapton H™ polyimide (Kapton is a trademark of E. I. Du Pont de Nemours & Co.), Apical AV polyimide (Apical is a trademark of Kanegafugi Chemical Company), or Upilex polyimide (Upilex is a trademark of UBE Industries, Ltd) for example. In one embodiment, free-standing Kapton™ polyimide is mounted on a rigid frame (not shown in FIG. 15) which rigidly supports the flexible film during processing and for end use if desired. An adhesive, typically comprising a material capable of adhering at a low temperature, can be applied to the rigid frame. Examples of suitable adhesives include materials such as ULTEM polyetherimide (ULTEM™ is a trademark of General Electric Company) and MULTIPOSIT™ XP-9500 thermoset epoxy (MULTIPOSIT is a trademark of Shipley Company Inc., Marlborough, Mass.).

In step 2, according to one embodiment, another adhesive 161, which is typically organic, such as ULTEM™, SPIE (siloxane polyimide epoxy) or other polyimide and epoxy blends, or cyanoacrylate is applied to the mounting substrate 160, as shown in FIG. 15. In step 3, one or more organic light emitting devices 200 are placed on the adhesive 161, and the adhesive is cured to bond the organic light emitting devices 200 to the mounting substrate 160.

In step 4, vias 169 are formed using laser ablation or reactive ion etching, for example, through the mounting substrate 160 and the adhesive 161 to the device contacting surfaces 163, 165 of the device electrical contacts 162, 164, respectively. In step 5, first and second mounting electrical contacts 172, 174 are formed or inserted into the via holes 169 to make contact with the device electrical contacts 162, 164, respectively. The mounting electrical contacts 172, 174 can be formed as a patterned metal layer using sputter or electroless plating techniques, in combination with electroplating if desired, and patterned with a standard photoresist and etch process. The interconnect metallization in one embodiment comprises a thin adhesion layer of 1000 angstroms (Å) sputtered titanium, coated by a thin layer of 3000 Å sputtered copper, coated by a layer of electroplated copper to a thickness of 4 microns, for example. An optional buffer layer of 1000 Å of titanium can be applied over the electroplated copper. The mounting electrical contacts 172, 174 can also be applied by the conventional methods of evaporation with a shadow mask or screen printing.

In step 6, the scattering layer 145 can be applied to organic light emitting devices 200 individually, or more typically can be applied across a number of organic light emitting devices 200, as shown in FIG. 15. Although not shown in step 6, a nonconductive material such as SPIE (siloxane polyimide epoxy) can be inserted into the gaps 175 between adjacent organic light emitting devices 200.

Although only two OLEDs 200 are shown in FIG. 15 for ease of illustration, this method is preferably used to make large area light emitting devices comprising many individual OLEDs 200. For example, a large area light emitting device, such as a 2 ft. by 2 ft. device, may be formed by attaching a plurality of individual OLEDs 200 to a mounting substrate 160 using the method described above or other mounting methods. This is advantageous in forming a large area light emitting device because the device is not limited by the size of the substrate used to make each OLED, in contrast to the display device of the '551 patent in which all the OLEDs are fabricated on the same glass substrate. Thus, the size of the display device of the '551 patent is limited by the size of the glass substrate. While mounting of prefabricated OLEDs to the mounting substrate, as illustrated in FIG. 15 is preferred, in an alternative aspect of the present invention, all OLEDs of the light emitting device may be directly fabricated on the same substrate.

Although embodiments of the present invention allow the organic light emitting devices 200 to be placed very close to each other on the mounting substrate 160, it may be desirable in some applications to have a larger spacing between individual organic light emitting devices 200. In such cases, it is desirable to also place the scattering layer between organic light emitting devices 200.

Spacing between organic light emitting devices 200 may also occur in the case where the mounting substrate 160 is designed to be flexible, curved, or non-planar. The mounting substrate 160 may be formed in any desired shape, e.g. to conform to an existing building structure. After the mounting electrical contacts have been installed, they can be connected to a suitable power supply, as illustrated in FIGS. 3–5, for example.

Other embodiments of the invention will be apparent to those skilled in the art from a consideration of the embodiments disclosed herein. It is intended that the specification and examples be considered as exemplary only, with the scope and spirit of the invention being defined by the following claims.

What is claimed is:

1. A method of making a light emitting device, comprising:

forming an array of OLEDsincluding a first and a second set;

electrically connecting the first set of OLEDs which emit light of a first color to a power source;

electrically connecting the second set of OLEDs which emit light of a different second color to the same power source; and forming a layer of scattering medium over the array of OLEDs;

the method further comprising mounting the array of individual OLEDs on a common substrate;

wherein the step of forming the array of OLEDs comprising forming each OLED and forming the array of OLEDs, and wherein the step of forming each OLED comprises:

forming a transparent electrode over a first substrate;

forming a polymer or molecular organic light emitting layer over the transparent electrode;

forming a metal electrode over the organic light emitting layer;

forming a sealing member above the metal electrode;

removing a portion of the organic light emitting layer above the transparent electrode to expose a first portion of a top surface of the transparent electrode;

forming a first metal device contact over the sealing member, which contacts the first portion of the top surface of the transparent electrode;

forming a second metal device contact over the sealing member, which contacts a top surface of the metal electrode; and wherein the step of forming the array comprises:

forming an adhesive layer over the mounting substrate;

attaching each OLED over the adhesive layer;

forming electrical contacts through the mounting substrate and the adhesive layer which contact the first and second device contacts; and forming the layer of scattering medium over the first substrate.

2. The method of claim 1, wherein:

the first set of OLEDs which emit light of a first color comprises a set of red emitting OLEDs;

the second set of OLEDs which emit light of a second color comprises a set of green emitting OLEDs; and further comprising electrically connecting a third set of OLEDs which emit blue light to the same power source.

3. The method of claim 1, wherein:

the first set of OLEDs which emit light of a first color comprises a set of red, green and blue light emitting OLEDs whose output appears as white light of a first color;

the second set of OLEDs which emit light of a first color comprises a set of red, green and blue light emitting OLEDs whose output appears as white light of a different second color.

4. The method of claim 1, wherein:

the first set of OLEDs which emit light of a first color comprises a set of blue light emitting OLEDs and a first phosphor whose combined output appears as white light having a first color temperature; and the second set of OLEDs which emit light of a second color comprises a set of blue light emitting OLEDs and a second phosphor whose combined output appears as white light having second color temperature different from the first color temperature.

* * * * *